United States Patent
Li et al.

(10) Patent No.: US 6,859,027 B2
(45) Date of Patent: Feb. 22, 2005

(54) DEVICE AND METHOD FOR MEASURING JITTER IN PHASE LOCKED LOOPS

(75) Inventors: Sung-Hung Li, Taipei Hsien (TW); Steven Su, Taipei Hsien (TW); Hsin-Chieh Lin, Taipei Hsien (TW)

(73) Assignee: VIA Optical Solution, Inc., Taipei Hsien (TW)

( * ) Notice: Subject to any disclaimer, the term of this patent is extended or adjusted under 35 U.S.C. 154(b) by 0 days.

(21) Appl. No.: 10/064,767

(22) Filed: Aug. 15, 2002

(65) Prior Publication Data

US 2003/0184278 A1 Oct. 2, 2003

(30) Foreign Application Priority Data

Mar. 26, 2002 (TW) .......................... 91105831 A (51) Int. Cl.[7] .............................................. G01R 23/12
(52) U.S. Cl. ................................ 324/76.53; 324/76.52; 702/69
(58) Field of Search ......................... 324/76.53, 76.59, 324/613, 76.52; 702/69, 117; 375/376

(56) References Cited

U.S. PATENT DOCUMENTS

| | | | | |
|---|---|---|---|---|
| 5,563,921 A | * | 10/1996 | Mesuda et al. | 375/376 |
| 5,754,437 A | * | 5/1998 | Blazo | 702/75 |
| 5,828,255 A | * | 10/1998 | Kelkar et al. | 327/157 |
| 6,528,982 B1 | * | 3/2003 | Yanagisawa et al. | 324/76.77 |
| 6,542,038 B2 | * | 4/2003 | Nishimura et al. | 331/1 A |
| 6,622,107 B1 | * | 9/2003 | West | 702/117 |
| 6,628,112 B2 | * | 9/2003 | Pisipaty | 324/76.53 |
| 6,640,193 B2 | * | 10/2003 | Kuyel | 702/69 |

\* cited by examiner

Primary Examiner—N. Le
Assistant Examiner—Walter Benson
(74) Attorney, Agent, or Firm—Jiang Chyun IP Office (57) ABSTRACT

A device and method for measuring the jitters of phase locked loop signals. A phase lead or phase lag relationship between an input signal and an output signal of a phase locked loop is found. According to the phase relationship and using multiplexers, a first phase difference signal and a second phase difference signal are re-routed to a subtraction unit and produces a jitter-level output signal. The jitter-level output signal represents the absolute value of the difference of pulse width between the first phase difference signal and the second phase difference signal.

15 Claims, 5 Drawing Sheets

DEVICE AND METHOD FOR MEASURING JITTER IN PHASE LOCKED LOOPS

CROSS REFERENCE TO RELATED APPLICATIONS

This application claims the priority benefit of Taiwan application serial no. 91105831, filed Mar. 26, 2002.

BACKGROUND OF INVENTION

1. Field of Invention

The present invention relates generally to phase locked loops. More particularly, the present invention relates to a device and method for measuring jitters in phase locked loops.

2. Description of Related Art

Due to rapid progress in electronic technologies, all kinds of electronic devices have been developed to ease our daily life. As electronic devices continue to improve, people rely upon the operational stability of the devices heavily. Phase locked loop (PLL) is one of the most commonly used electronic devices in the technologies, a PLL contains essentially a phase detector, amplifier, and voltage controlled oscillator (VCO). A few of its applications are tone decoding, demodulation of AM and FM signals, frequency multiplications, frequency synthesis, pulse synchronization of signals from noisy sources, and regeneration of "clean" signals. The jittering content of a phase locked loop is one principle factor that affects the phase locked loop performance as well as circuit stability. Hence, the jitter within a phase lock loop signal must be carefully monitored.

In the past, signal jitters are often monitored visually through an oscilloscope or other instruments. In a visual inspection, minor differences may escape our visual detection and the observed jitters are difficult to measure. Moreover, apart from the need of operating a complicated instrument for jitter measurements, the measured results are not available to be used by other circuits within the same device, unlike a built-in device.

SUMMARY OF INVENTION

Accordingly, one object of the present invention is to provide a device and a method of measuring the jitters carried within a phase locked loop signal. Jitters between a phase locked loop input signal and output signal are measured and quantified through a simple built-in circuit inside the device system and the measured results are distributed to other circuits so that the jittery condition and hence circuit stability is improved.

To achieve these and other advantages and in accordance with the purpose of the invention, as embodied and broadly described herein, the invention provides a device for measuring the jitters within a phase locked loop signal. A phase detection circuit inside the phase locked loop provides a first phase difference signal and a second phase difference signal. The device for measuring jitters in a phase locked loop signal includes a phase relationship detection unit and jitter-level output unit. The phase relationship detection unit outputs a phase relationship signal that represents the phase difference between the input signal and the output signal according to the phase relationship between the input signal and the output signal. The jitter-level output unit generates a jitter-level output signal that represents the amount of jitter between the input signal and the output signal according to the first phase difference signal, the second phase difference signal and the phase relationship signal. The jitter-level output signal is directly proportional to the absolute value of the difference in pulse width (or duty) between the first phase difference signal and the second phase difference signal.

In one embodiment of this invention, the phase relationship detection unit includes a triggering circuit and a D-type flip-flop. The triggering circuit receives the input signal and produces a triggering signal when a triggering transition of the input signal is encountered. The D-type flip-flop receives the output signal as data input signal and the triggering signal as a clocking signal to produce a phase relationship signal. The phase relationship signal is used to distinguish between the conditions of having the phase of the output signal leading the input signal and having the phase of the output signal lagging behind the input signal. The triggering signal includes a delay circuit and a XOR gate. The delay circuit receives the input signal and delays the input signal by a predetermined period before releasing the signal as a delayed input signal. The XOR gate receives the input signal and the delayed input signal and performs a logic operation to produce the triggering signal. In an alternative embodiment, the triggering circuit directly uses the input signal to serve as the triggering signal.

In a second embodiment of this invention, the jitter-level output unit includes a first multiplexer, a second multiplexer, a first low-pass filter, a second low-pass filter and a subtraction unit. The first multiplexer receives the first phase difference signal, the second phase difference signal and the phase relationship signal. When a phase relationship signal that indicates the phase of the output signal leading the input signal is received, the first multiplexer selectively outputs the second phase difference signal as an output signal from the first multiplexer. On the other hand, when a phase relationship signal that indicates the phase of the output signal lagging behind the input signal is received, the first multiplexer selectively outputs the first phase difference signal as an output signal from the first multiplexer. Similarly, the second multiplexer receives the first phase difference signal, the second phase difference signal and the phase relationship signal. When a phase relationship signal that indicates the phase of the output signal leading the input signal is received, the second multiplexer selectively outputs the first phase difference signal as an output signal from the first multiplexer. On the other hand, when a phase relationship signal that indicates the phase of the output signal lagging behind the input signal is received, the second multiplexer selectively outputs the second phase difference signal as an output signal from the second multiplexer. The first low-pass filter receives the output signal from the first multiplexer and converts the signal into a first low-pass output signal. The second low-pass filter receives the output signal from the second multiplexer and converts the signal into a second low-pass output signal. The subtraction unit receives the first low-pass output signal and the second low-pass output signal and computes a pulse width difference value to produce the jitter-level output signal.

In a third embodiment of this invention, the first phase difference signal is asserted at the data transition points of the input signal and de-asserted at the next triggered transition state of the output signal after the generation of the second phase difference signal. The second phase difference signal is asserted at the next non-triggered transition state of the output signal after the data transition of the input signal. The second phase difference signal is maintained for a full cycle period of the output signal.

In a fourth embodiment of this invention, the first phase difference signal is asserted at the triggering state transition point of the input signal when the phase of the input signal leads the output signal. The first phase difference signal is de-asserted at a subsequent triggering state transition point of the output signal. The second phase difference signal is asserted at the triggering state transition point of the output signal when the phase of the input signal lags behind the output signal. The second phase difference signal is de-asserted at a subsequent triggering state transition point of the input signal.

This invention also provides a method of measuring the jitters within a phase locked loop signal so that the jitters between the phase locked loop input signal and the output signal may be quantified. The method includes the following steps. First, a first phase difference signal and a second phase difference signal are provided. A phase relationship signal capable of indicating whether the phase of the output signal leads or lags the input signal is obtained. According to the phase relationship signal, a jitter-level output signal capable of indicating the difference in pulse width between the first phase difference signal and the second phase difference signal is obtained.

In brief, the device for measuring the jitters within a phase locked loop signal has a simple circuit design and is capable of quantifying the jitters between the phase locked loop input signal and the output signal. Moreover, the simplified circuit may be incorporated into the system to form a built-in device that provides measured data to other circuits. Ultimately, jittery condition and hence stability of the phase lock loop circuit is improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1:
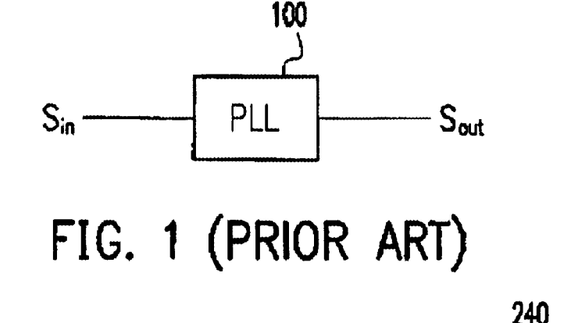
FIG. 1 is a schematic diagram of a phase locked loop.

FIG. 1 is a schematic diagram of a phase locked loop 100. As shown in FIG. 1, an input signal $S_{in}$ is sent to the phase locked loop 100 and an output signal $S_{out}$ is produced by the phase locked loop 100. The phase locked loop 100 is commonly used in various types of electronic circuits. A phase locked loop contains essentially a phase detector, amplifier, and voltage-controlled oscillator (VCO), as well as a charge-pump circuit. A few of its applications are tone decoding, demodulation of AM and FM signals, frequency multiplications, frequency synthesis, pulse synchronization of signals from noisy sources, regeneration of "clean" signals, clock recovery and waveform shaping of clocking signal during data transmission. When the phase locked loop needs to recover clocking signal during a data transmission session, the transmission data signal whose clocking signal needs to be recovered is fed to the input terminal $S_{in}$ so that the recovered clocking signal appears at the output terminal $S_{out}$. When the phase locked loop serves as a frequency multiplier of the clocking signal or a wave-shaper of the clocking signal, both the input signal $S_{in}$ and the output signal $S_{out}$ are clocking signals.

Figure 2:
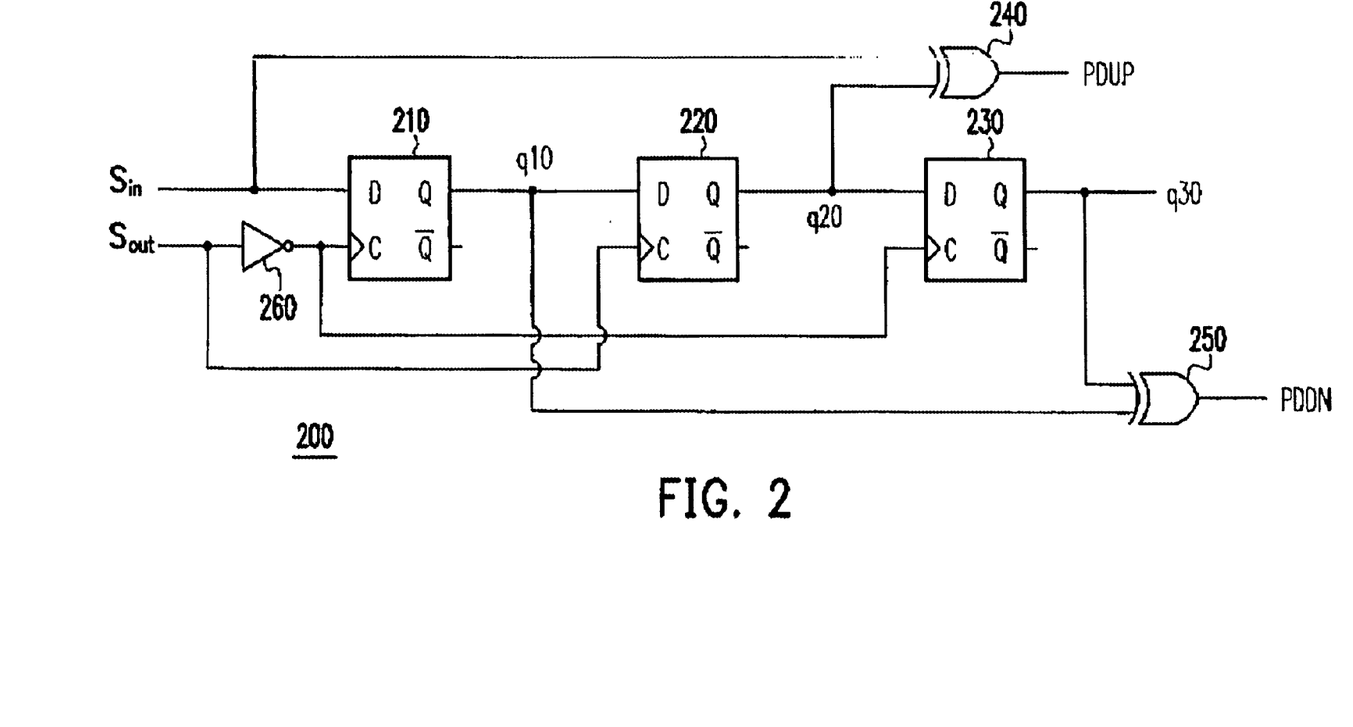
FIG. 2 is a block diagram of a phase detection circuit inside a phase locked loop according to a first preferred embodiment of this invention.
Figure 5:
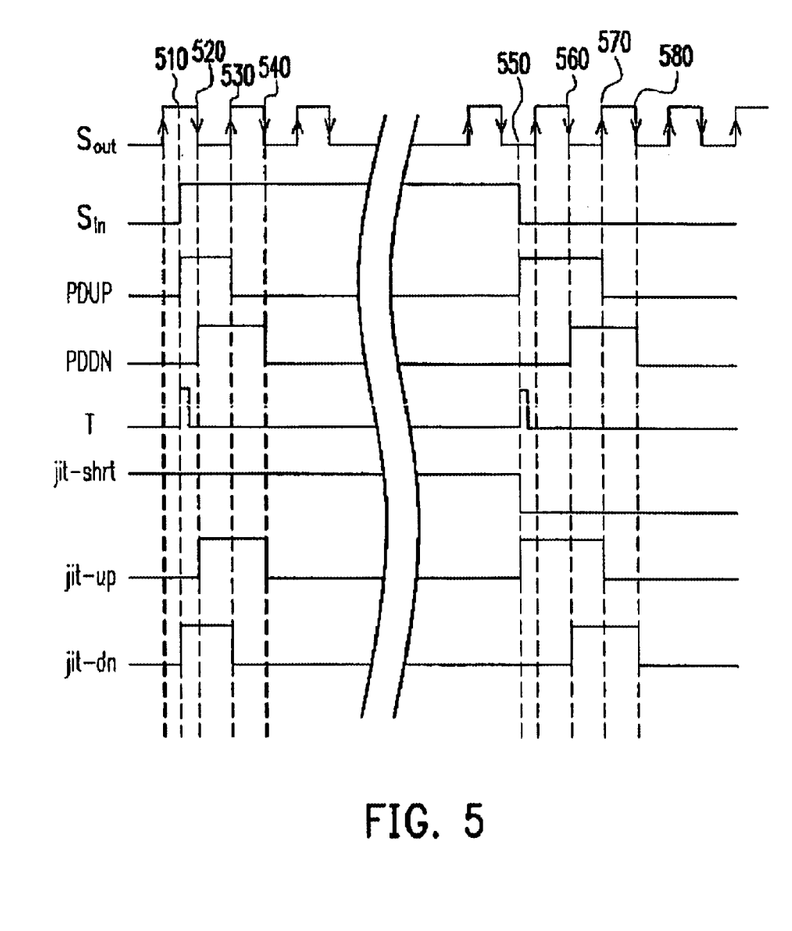
FIG. 5 is a diagram showing various waveforms produced by the phase locked loop and the jitter-measuring device according to the first preferred embodiment of this invention.

FIG. 2 is a block diagram of a phase detection circuit inside a phase locked loop according to a first preferred embodiment of this invention. In this embodiment, the phase locked loop serves as a clock recovery function during data transmission. Hence, transmission data signal that requires a clock recovery is fed to the input terminal $S_{in}$ while the recovered clocking signal is output from the output terminal $S_{out}$. As shown in FIG. 2, the phase detection circuit 200 receives the input signal $S_{in}$ and output signal $S_{out}$ and generates a first phase difference signal (PDUP) and a second phase difference signal (PDDN). The phase detection circuit 200 includes three D-type flip-flops 210, 220, 230, two XOR gates 240, 250 and an inverter 260. However, there is no limitation to the type of devices selected. Other circuits capable of outputting a first phase difference signal (PDUP) and a second phase difference signal (PDDN) that match the waveform relationship with the input signal $S_{in}$ and the output signal $S_{out}$ may be employed. FIG. 5 is a diagram showing the waveforms produced by the phase locked loop and a jitter-measuring device according to the first preferred embodiment of this invention. As shown in FIG. 5, the first phase difference signal (PDUP) is asserted at the data transition points 510, 550 of the input signal $S_{in}$. The first phase difference signal (PDUP) is de-asserted at the next triggered state transition points 530, 570 of the output signal $S_{out}$ (for example, positive edge triggered here) after the transitions 520, 560 of the second phase difference signal (PDDN). The second phase difference signal (PDDN) is asserted at the next non-triggered transition pints 520, 560 of the output signal $S_{out}$ after the data transition points 510, 550 of the input signal $S_{in}$ have occurred. The second phase difference signal (PDDN) is maintained for a full cycle of the output signal $S_{out}$.

Figure 3:
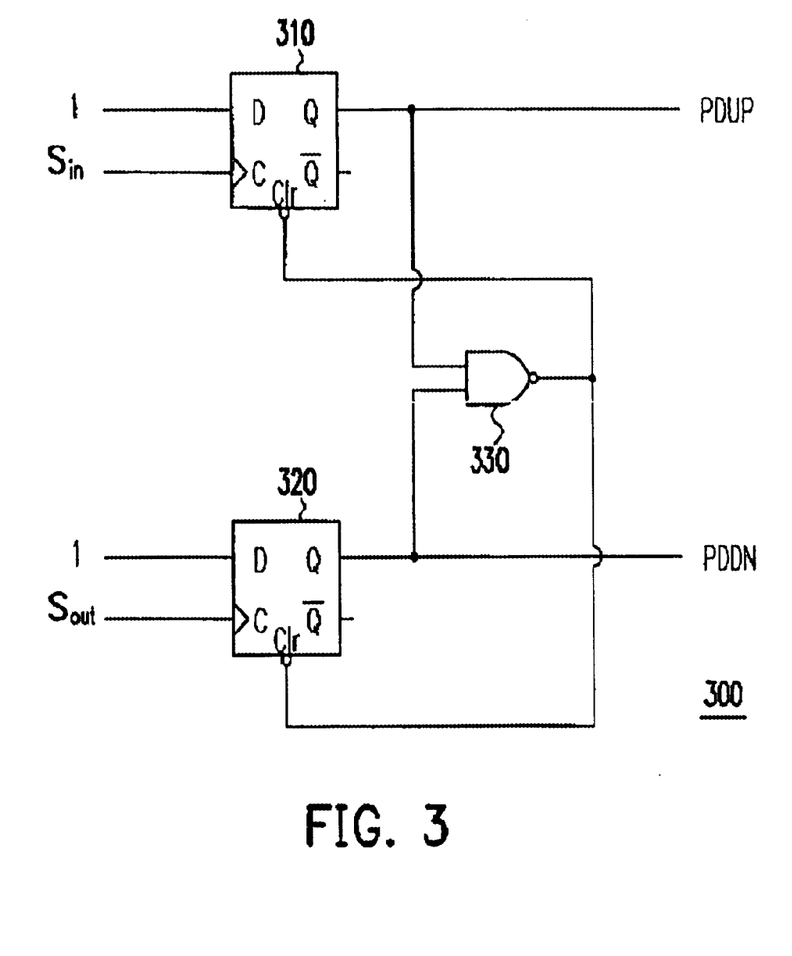
FIG. 3 is a block diagram of a phase detection circuit inside a phase locked loop according to a second preferred embodiment of this invention.
Figure 6:
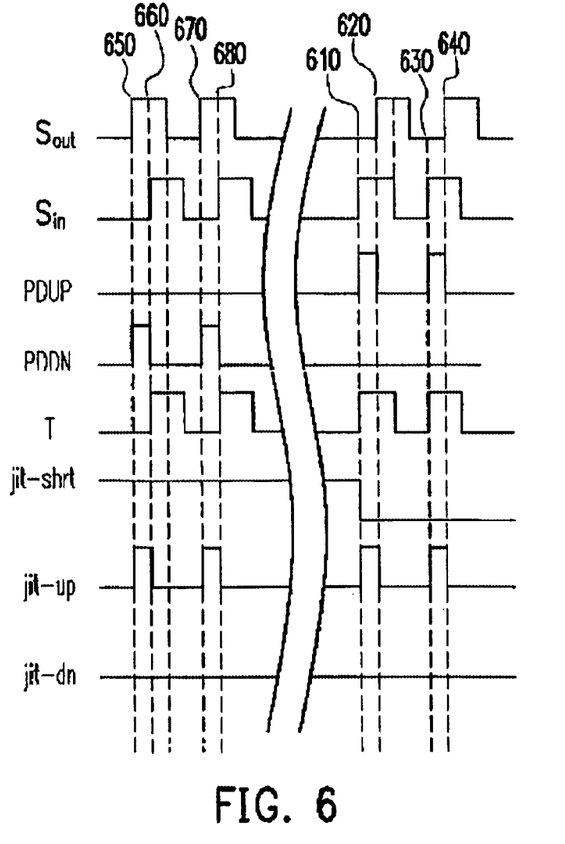
FIG. 6 is a diagram showing various waveforms produced by the phase locked loop and the jitter-measuring device according to the second preferred embodiment of this invention.

FIG. 3 is a block diagram of a phase detection circuit inside a phase locked loop according to a second preferred embodiment of this invention. In this embodiment, the phase locked loop serves as a waveform shaper of the clocking signal. Hence, the clocking signal to be shaped is input through the input signal terminal $S_{in}$ and the shaped clocking signal is output from the output terminal $S_{out}$. As shown in FIG. 3, the phase detection circuit 300 receives the input signal $S_{in}$ and the output signal $S_{out}$ and produces a first phase difference signal PDUP and a second phase difference signal PDDN. The phase detection circuit 300 includes two D-type flip-flops 310, 320 and a NAND gate 330. However, there is no limitation to the type of devices selected. Other circuits capable of outputting a first phase difference signal (PDUP) and a second phase difference signal (PDDN) that matches the waveform relationship with the input signal $S_{in}$ and the output signal $S_{out}$ may be employed. FIG. 6 is a diagram showing the waveforms produced by the phase locked loop and the jitter-measuring device according to the second preferred embodiment of this invention. As shown in FIG. 6, the first phase difference signal (PDUP) is asserted at the triggering state transition points 610, 630 of the input signal $S_{in}$ when the phase of the input signal $S_{in}$ leads the output signal $S_{out}$ (positive edge triggered in the example). The first phase difference signal (PDUP) is de-asserted at the subsequent triggering state transition points 620, 640 of the output signal $S_{out}$. Similarly, the second phase difference signal (PDDN) is asserted at the triggering state transition points 650, 670 of the output signal $S_{out}$ when the phase of the input signal $S_{in}$ lags behind the output signal $S_{out}$. The second phase difference signal (PDDN) is de-asserted at the subsequent triggering state transition points 660, 680 of the input signal $S_{in}$.

According to the waveforms of the input signal $S_{in}$, the output signal $S_{out}$, the first phase difference signal (PDUP) and the second phase difference signal (PDDN) shown in FIGS. 5 and 6, the absolute value of the difference in pulse width (or duty cycle) between the first phase difference signal (PDUP) and the second phase difference signal (PDDN) is directly proportional to the jitters of the input signal $S_{in}$ and the output signal $S_{out}$. When the phase of the output signal $S_{out}$ leads the input signal $S_{in}$, the pulse width of the first phase difference signal (PDUP) is smaller than the pulse width of the second phase difference signal (PDDN). On the contrary, when the phase of the output signal $S_{out}$ lags behind the input signal $S_{in}$, the pulse width of the first phase difference signal (PDUP) is larger than the pulse width of the second phase difference signal (PDDN).

Figure 4:
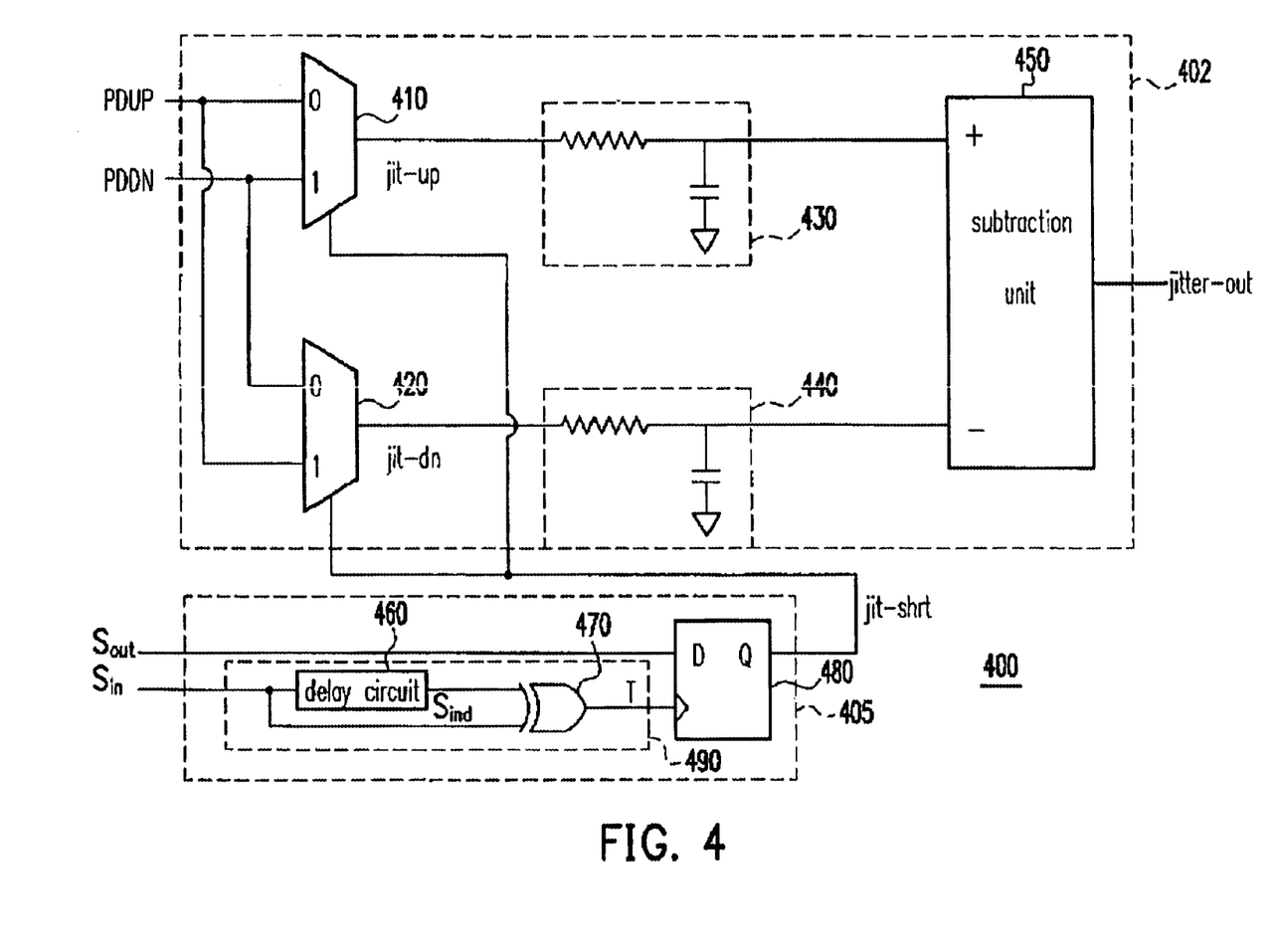
FIG. 4 is a block diagram of a jitter-measuring device for a phase locked loop signal according to one preferred embodiment of this invention.

FIG. 4 is a block diagram of the jitter-measuring device 400 for a phase locked loop signal according to one preferred embodiment of this invention. As shown in FIG. 4, the signal jitter-measuring device receives the input signal $S_{in}$ whose signal jitter needs to be quantified, and the output signal $S_{out}$ from the phase locked loop 100 and the first phase difference signal (PDUP), second phase difference signal (PDDN) from the phase detection circuit as shown in FIG. 2 or 3. The signal jitter-measuring device outputs a quantified jitter output signal (jitter-out). The jitter-measuring device 400 of the phase locked loop includes a phase relationship detection unit 405 and a jitter-level output unit 402.,The phase relationship detection unit 405 receives the input signal $S_{in}$ and the output signal $S_{out}$ and outputs a phase relationship signal (jit-shrt) that indicates whether the phase of the output signal $S_{out}$ leads or lags the input signal $S_{in}$. Refer to FIGS. 5 and 6 for the waveforms. When the phase of the output signal $S_{out}$ leads the input signal $S_{in}$, the phase relationship signal (jit-shrt) is high. On the other hand, when the phase of the output signal $S_{out}$ lags behind the input signal $S_{in}$, the phase relationship signal (jit-shrt) is low. The jitter-level output unit 402 is coupled to the phase relationship detection unit 405 for producing the jitter output signal (jitter-out) that represents the jitter between the input signal $S_{in}$ and the output signal $S_{out}$ according to the first phase difference signal (PDUP), the second phase difference signal (PDDN) and the phase relationship signal (jit-shrt). Size of the jitter output signal (jitter-out) is directly proportional to the absolute value of the pulse width difference between the first phase difference signal (PDUP) and the second phase difference signal (PDDN).

The phase relationship detection unit 405 of FIG. 4 includes a triggering circuit 490 and a D-type flip-flop 480.

The triggering circuit 490 receives the input signal $S_{in}$ and asserts a triggering signal T when the input signal $S_{in}$ contains transition-triggering points such as 510, 550 in FIG. 5 and 660, 680, 610, 630 in FIG. 6. Note that the triggering circuit 490 in FIG. 4 is applicable to both the first preferred embodiment in FIG. 2 and the second preferred embodiment in FIG. 3 of this invention. The triggering circuit 490 includes a delay circuit 460 and a XOR gate 470. The delay circuit 460 receives the input signal $S_{in}$ and delays the input signal $S_{in}$ by a period to produce a delayed input signal $S_{ind}$. The XOR gate 470 is coupled to the delay circuit 460 for performing a logic computation of the input signal $S_{in}$ and the delay input signal $S_{ind}$ and outputting the triggering signal T. In the second preferred embodiment of FIG. 3, the input signal $S_{in}$ is directly used as the triggering signal T. The D-type flip-flop of the phase relationship detection unit 405 receives the output signal $S_{out}$ as data input and the triggering signal T as a clocking signal to produce the phase relationship signal (jit-shrt) waveform as shown in FIGS. 5 and 6.

The jitter-level output unit 402 includes a first multiplexer 410, a second multiplexer 420, a first low-pass filter 430, a second low-pass filter 440 and a subtraction unit 450. The first multiplexer 410 receives the first phase difference signal (PDUP) and the second phase difference signal (PDDN) and uses the phase relationship signal (jit-shrt) as a multiplexer selection signal. When the phase relationship signal (jit-shrt) is high (indicating the output signal $S_{out}$ leads the input signal $S_{in}$) the second phase difference signal (PDDN) is chosen as the output signal (jit-up) from the first multiplexer 410. Conversely, the first phase difference signal (PDUP) is chosen as the output signal (jit-up) from the first multiplexer 410. Similarly, the second multiplexer 420 receives the first phase difference signal (PDUP) and the second phase difference signal (PDDN) and uses the phase relationship signal (jit-shrt) as a multiplexer selection signal. When the phase relationship signal (jit-shrt) is high (indicating the output signal $S_{out}$ leads the input signal $S_{in}$) the first phase difference signal (PDUP) is chosen as the output signal (jit-dn) from the second multiplexer 420. Conversely, the second phase difference signal (PDDN) is chosen as the output signal (jit-dn) from the second multiplexer 420. Nevertheless, the output signal (jit-up) inside the jitter-level output unit 402 with respect to the second preferred embodiment in FIG. 3 can simply be generated alternatively by OR-gated the first phase difference signal (PDUP) and the second phase difference signal (PDDN). The first multiplexer output signal (jit-up) and the second multiplexer output signal (jit-dn) pass through the first low-pass filter 430 and the second low-pass filter 440 respectively. The first low-pass filter 430 and the second low-pass filter 440 are resistance-capacitance (RC) low-pass circuits, for example. The subtraction unit 450 computes a difference value (representing the difference in pulse width between the first phase difference signal (PDUP) and the second phase difference signal (PDDN)) and produces the jitter-level output signal (jitter-out) that indicates the jittering level of the phase locked loop.

A method of quantifying the jitters between the input signal $S_{in}$ and the output signal $S_{out}$ of a phase locked loop can also be derived from the aforementioned jitter-measuring device. First, a first phase difference signal (PDUP) and a second phase difference signal (PDDN) are provided. A phase relationship signal (jit-shrt) indicating whether the output signal $S_{out}$ leads or lags the input signal $S_{in}$ is obtained. According to the phase relationship signal (jit-shrt), a jitter-level output signal (jitter-out) directly proportional to the absolute value of the difference in pulse width between the first phase difference signal (PDUP) and the second phase difference signal (PDDN) is acquired.

In conclusion, the phase locked loop signal jitter measuring device and method according to this invention requires no imprecise visual inspection or complicated measuring instruments. A simple circuit is used to quantify the jitter between the input signal and the output signal of the phase locked loop. The simple circuit may integrate into the system and information regarding the measured jitter level may distribute to other circuits so that jittery condition and hence circuit stability is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal jitter measuring device for quantifying a jitter between an input signal fed into a phase locked loop and a corresponding output signal from the phase locked loop, wherein the phase locked loop provides a first phase difference signal and a second phase difference signal therein, said measuring device comprising:

a phase-relationship detection unit for outputting a phase relationship signal that corresponds to the phase relationship between said output signal and said input signal of the phase locked loop; and a jitter-level output unit coupled to said phase-relationship detection unit and responsive to said first phase difference signal, said second phase difference signal and said phase relationship signal for generating a jitter-level output signal that corresponds to the level of jitter between said output signal and said input signal of the phase locked loop;

wherein said jitter-level output signal is a pulse width difference between said first phase difference signal and said second phase difference signal.

2. The signal jitter measuring device of claim 1, wherein the phase-relationship detection unit comprises:

a triggering unit responsive to said input signal of the phase locked loop for generating a triggering signal; and a D-type flip-flop taking said output signal of the phase locked loop as its input data and said triggering signal as its input clock to produce said phase relationship signal.

3. The signal jitter measuring device of claim 2, wherein the triggering unit includes:

a delay circuit for delaying said input signal to produce a delayed input signal; and a XOR gate for receiving said input signal and said delayed input signal and producing said triggering signal.

4. The signal jitter measuring device of claim 1, wherein the jitter-level output unit includes:

a first multiplexer for receiving said first phase difference signal, said second phase difference signal and said phase relationship signal, and selectively outputting said second phase difference signal when said phase relationship signal indicates the phase of said output signal leads said input signal, and selectively outputting said first phase difference signal when said phase relationship signal indicates the phase of said output signal lags behind the input signal;

a second multiplexer for receiving said first phase difference signal, said second phase difference signal and said phase relationship signal, and selectively outputting said first phase difference signal when said phase relationship signal indicates the phase of said output signal leads said input signal, and selectively outputting said second phase difference signal when said phase relationship signal indicates the phase of said output signal lags behind said input signal;

a first low-pass filter for converting the output of said first multiplexer into a first low-pass output signal;

a second low-pass filter for converting the output of said second multiplexer into a second low-pass output signal; and a subtraction unit for receiving said first low-pass output signal and said second low-pass output signal which computes said pulse width difference between said first phase difference signal and said second phase difference signal and produces said jitter-level output signal.

5. The signal jitter measuring device of claim 4, wherein the first low-pass filter and the second low-pass filter are RC low-pass filtering circuits.

6. The signal jitter measuring device of claim 1, wherein the first phase difference signal is asserted at the data transition points of said input signal and de-asserted at the next trigger transition point of said output signal after the generation of said second phase difference signal, and the second phase difference signal is asserted at the next non-triggered transition point of said output signal after the data transition of said input signal, and the second phase difference signal is maintained for a full cycle of said output signal.

7. The signal jitter measuring device of claim 1, wherein the first phase difference signal is asserted at the triggering transition points of said input signal when the phase of said input signal leads said output signal and de-asserted at subsequent triggering transition points of said output signal, the second phase difference signal is asserted at the triggering transition points of said output signal when said input signal lags behind said output signal and de-asserted at subsequent triggering transition points of said input signal.

8. A phase locked loop having an input signal and an output signal, and capable of providing information on signal jitter, said phase locked loop comprises:

a phase detection circuit in respond to said input signal and said output signal for providing a first phase difference signal and a second phase difference signal; and a signal jitter measuring device coupled to said phase detection circuit and responsive to said first phase difference signal and said second phase difference signal for generating a jitter-level output signal that corresponds to the jitter level between said input signal and said output signal of said phase locked loop;

wherein said jitter-level output signal is related to the difference in pulse width between said first phase difference signal and said second phase difference signal.

9. The phase locked loop of claim 8, wherein the first phase difference signal is asserted at the data transition points of said input signal and de-asserted at the next triggered transition points of said output signal after the generation of said second phase difference signal, the second phase difference signal is asserted at the next non-triggered transition points of said output signal after data transition of said input signal, and said second phase difference signal is maintained for a full cycle of said output signal.

10. The phase locked loop of claim 8, wherein said first phase difference signal is asserted at the triggering transition points of said input signal when the phase of said input signal leads said output signal and de asserted at subsequent triggering transition points of said output signal, and said second phase difference signal is asserted at said triggering transition points of said output signal when said input signal lags behind said output signal and de-asserted at subsequent triggering transition points of said input signal.

11. The phase locked loop of claim 8, wherein the signal jitter measuring device comprises:
   a phase-relationship detection unit for outputting a phase relationship signal that corresponds to the phase relationship between said output signal and said input signal of the phase locked loop; and
   a jitter-level output unit coupled to said phase-relationship detection unit and responsive to said first phase difference signal, said second phase difference signal and said phase relationship signal for generating said jitter-level output signal.

12. The phase locked loop of claim 11, wherein the phase-relationship detection unit comprises:
   a triggering unit responsive to said input signal of said phase locked loop for generating a triggering signal; and
   a D-type flip-flop taking said output signal of said phase locked loop as its input data and said triggering signal as its input clock to produce said phase relationship signal.

13. The phase locked loop of claim 12, wherein the triggering unit includes:
   a delay circuit for delaying said input signal to produce a delayed input signal; and
   a XOR gate for receiving said input signal and said delayed input signal and producing said triggering signal.

14. The phase locked loop of claim 11, wherein the jitter-level output unit includes:
   a first multiplexer for receiving said first phase difference signal, said second phase difference signal and said phase relationship signal, and selectively outputting said second phase difference signal when said phase relationship signal indicates the phase of said output signal leads said input signal, and selectively outputting said first phase difference signal when said phase relationship signal indicates the phase of said output signal lags behind the input signal;
   a second multiplexer for receiving said first phase difference signal, said second phase difference signal and said phase relationship signal, and selectively outputting said first phase difference signal when said phase relationship signal indicates the phase of said output signal leads said input signal, and selectively outputting said second phase difference signal when said phase relationship signal indicates the phase of said output signal lags behind said input signal;
   a first low-pass filter for converting the output of said first multiplexer into a first low-pass output signal;
   a second low-pass filter for converting the output of said second multiplexer into a second low-pass output signal; and
   a subtraction unit for receiving said first low-pass output signal and said second low-pass output signal, which computes the difference in pulse width between said first phase difference signal and said second phase difference signal and produces said jitter-level output signal.

15. The phase locked loop of claim 14, wherein the first low-pass filter and the second low-pass filter are RC low-pass filtering circuits.

* * * * *